United States Patent
Liu et al.

(10) Patent No.: US 10,878,879 B2
(45) Date of Patent: Dec. 29, 2020

(54) REFRESH CONTROL METHOD FOR MEMORY SYSTEM TO PERFORM REFRESH ACTION ON ALL MEMORY BANKS OF THE MEMORY SYSTEM WITHIN REFRESH WINDOW

(71) Applicant: MEDIATEK INC., Hsin-Chu (TW)

(72) Inventors: Der-Ping Liu, Taoyuan County (TW); Bo-Wei Hsieh, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 16/011,779

(22) Filed: Jun. 19, 2018

(65) Prior Publication Data

US 2018/0374533 A1  Dec. 27, 2018

Related U.S. Application Data

(60) Provisional application No. 62/522,816, filed on Jun. 21, 2017.

(51) Int. Cl.
   *G11C 11/406* (2006.01)
   *G11C 7/22* (2006.01)
   *G11C 11/4076* (2006.01)

(52) U.S. Cl.
   CPC .......... *G11C 11/40618* (2013.01); *G11C 7/22* (2013.01); *G11C 11/4076* (2013.01); *G11C 11/40611* (2013.01); *G11C 11/40626* (2013.01); *G11C 2211/4067* (2013.01)

(58) Field of Classification Search
   CPC ........ G11C 11/40618; G11C 11/40626; G11C 11/40611; G11C 7/22
   See application file for complete search history.

(56) References Cited

U.S. PATENT DOCUMENTS

| | | | |
|---|---|---|---|
| 6,859,407 B1 * | 2/2005 | Suh | G11C 11/406 365/203 |
| 9,117,542 B2 * | 8/2015 | Bains | G11C 11/40611 |
| 9,691,468 B2 * | 6/2017 | Bains | G11C 11/40611 |
| 2005/0068826 A1 * | 3/2005 | Hoehler | G11C 11/406 365/203 |

(Continued)

OTHER PUBLICATIONS

JESD209-4 (JEDEC Standard, Low Power Double Data Rate 4, Aug. 2014) (Year: 2014).*

(Continued)

*Primary Examiner* — Mushfique Siddique
(74) *Attorney, Agent, or Firm* — Wolf, Greenfield & Sacks, P.C.

(57) ABSTRACT

A refresh control method for a memory controller of a memory system is provided. The memory controller is connected with a memory. The memory includes plural memory banks. The refresh control method includes the following steps. Firstly, a refresh state of the memory device is read, and thus a refresh window is realized. Then, a refresh command is issued to the memory device according to the refresh state. The refresh command contains a memory bank number field and a memory bank count field. The memory bank count field indicates a first count. The first count of memory banks are selected from the plural memory banks of the memory device according to the memory bank number field and the first count. Moreover, a refresh operation is performed on the first count of memory banks.

11 Claims, 5 Drawing Sheets

(56) References Cited

U.S. PATENT DOCUMENTS

| | | | | |
|---|---|---|---|---|
| 2006/0143372 A1* | 6/2006 | Walker | ............... | G11C 11/406 |
| | | | | 711/106 |
| 2010/0128547 A1* | 5/2010 | Kagami | ............... | G11C 11/406 |
| | | | | 365/222 |
| 2013/0182522 A1* | 7/2013 | Lim | ............... | G11C 11/40618 |
| | | | | 365/222 |
| 2014/0185403 A1* | 7/2014 | Lai | ............... | G11C 11/40626 |
| | | | | 365/222 |
| 2015/0380069 A1 | 12/2015 | Matsui | | |
| 2017/0110177 A1* | 4/2017 | Lee | ............... | G11C 11/40615 |
| 2018/0025771 A1* | 1/2018 | Bains | ............... | G11C 11/40615 |
| | | | | 365/222 |

OTHER PUBLICATIONS

TIPO Office Action dated Sep. 27, 2019 in Taiwan application (No. 107133494).
Taiwan Office Action dated Feb. 24, 2020 in Taiwan application (No. 107133494).
English language translation (machine translation) of Taiwan Office Action dated Feb. 24, 2020 in Taiwan application (No. 107133494).
JEDEC Standard, Low Power Double Data Rate 4(LPDDR4), JESD209-4, Aug. 2014. Fig. 26, 32, 35; Table 63; p. 16, 22, 70-71, 82,151.

\* cited by examiner

| Refresh state | $t_{REFi}$ (μs) |
|---|---|
| x0.125 | 0.4875 |
| x0.25 | 0.975 |
| x0.5 | 1.95 |
| x0.67 | 2.613 |
| x1 | 3.9 |
| x1.11 | 4.329 |
| x1.33 | 5.187 |
| x1.5 | 5.85 |
| x2 | 7.8 |
| x4 | 15.6 |
| x6 | 23.4 |
| x8 | 31.2 |

| CMD | CS | CA0 | CA1 | CA2 | CA3 | CA4 | CA5 | CA6 | CLK |
|---|---|---|---|---|---|---|---|---|---|
| REFRESH | H | L | L | L | H | H | H | L | ↑ |
|  | X | BA0 | BA1 | BA2 | BA3 | MB | | AB | ↓ |

| CMD | CS | CA0 | CA1 | CA2 | CA3 | CA4 | CA5 | CA6 | CLK |
|---|---|---|---|---|---|---|---|---|---|
| REFRESH | H | L | L | L | H | H | H | L | ↑ |
|  | X | X | X | X | X | X | X | H | ↓ |

| CMD | CS | CA0 | CA1 | CA2 | CA3 | CA4 | CA5 | CA6 | CLK |
|---|---|---|---|---|---|---|---|---|---|
| REFRESH | H | L | L | L | H | H | H | L | ↑ |
|  | X | L | L | H | H | L | L | L | ↓ |

| CMD | CS | CA0 | CA1 | CA2 | CA3 | CA4 | CA5 | CA6 | CLK |
|---|---|---|---|---|---|---|---|---|---|
| REFRESH | H | L | L | L | H | H | H | L | ↑ |
|  | X | H | H | L | X | H | L | L | ↓ |

| CMD | CS | CA0 | CA1 | CA2 | CA3 | CA4 | CA5 | CA6 | CLK |
|---|---|---|---|---|---|---|---|---|---|
| REFRESH | H | L | L | L | H | H | H | L | ↱ |
|  | X | H | L | X | X | L | H | L | ↴ |
FIG. 5D
| CMD | CS | CA0 | CA1 | CA2 | CA3 | CA4 | CA5 | CA6 | CLK |
|---|---|---|---|---|---|---|---|---|---|
| REFRESH | H | L | L | L | H | H | H | L | ↱ |
|  | X | H | X | X | X | H | H | L | ↴ |
FIG. 5E
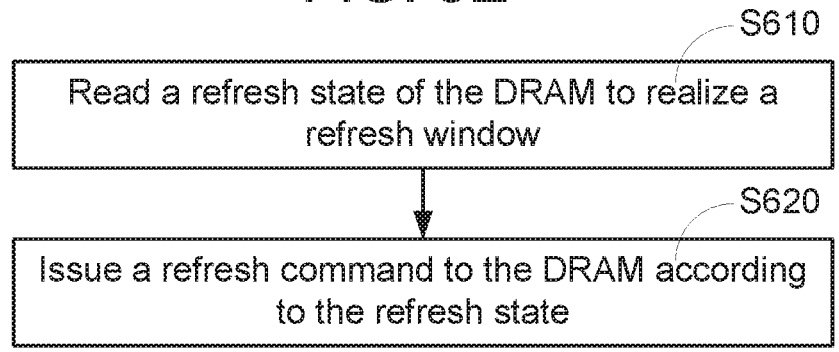
FIG. 6A
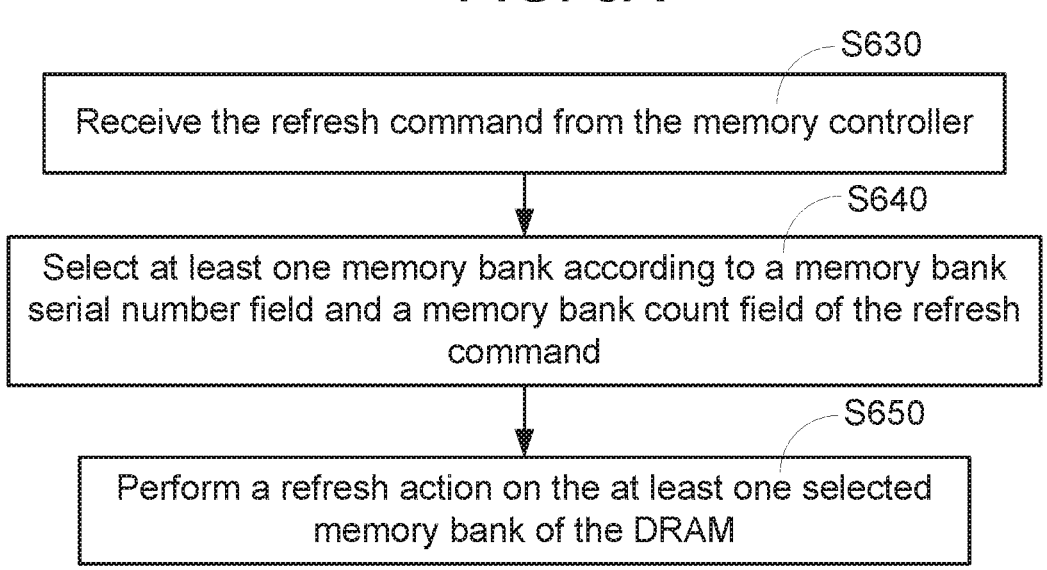
FIG. 6B

| CMD | CS | CA0 | CA1 | CA2 | CA3 | CA4 | CA5 | CA6 | CLK |
|---|---|---|---|---|---|---|---|---|---|
| REFRESH | H | L | L | L | H | H | H | L | ⎍ |
| | X | BA0 | BA1 | BA2 | BA3 | | | AB | ⎎ |
FIG. 8
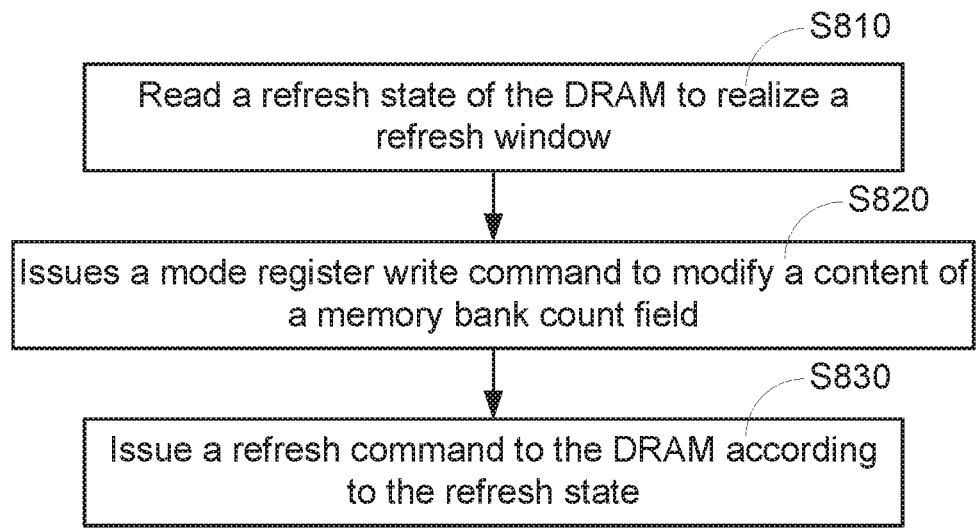
FIG. 9A
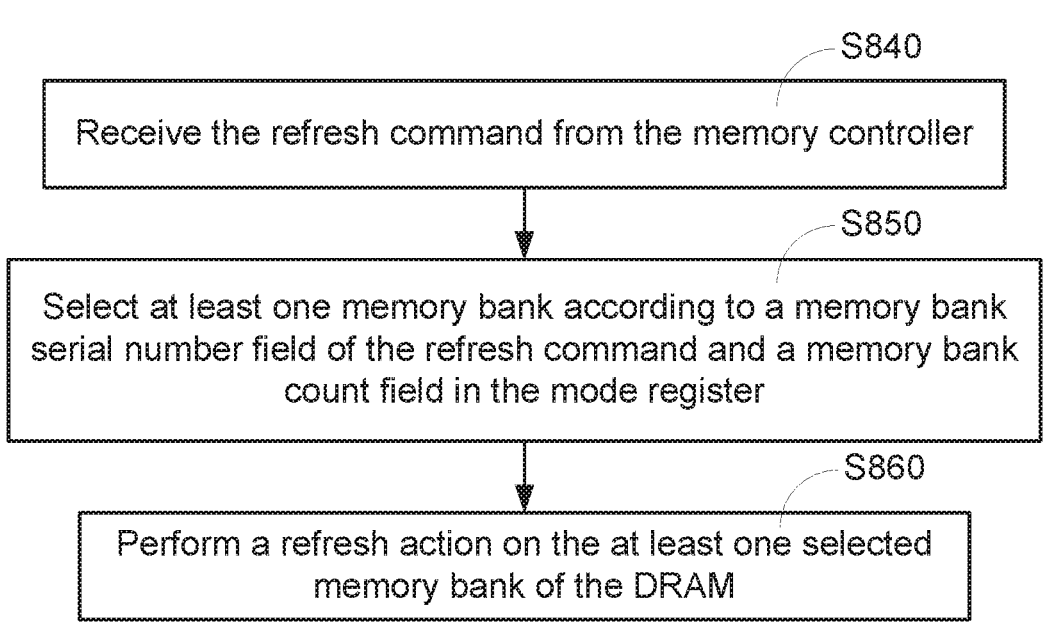
FIG. 9B

REFRESH CONTROL METHOD FOR MEMORY SYSTEM TO PERFORM REFRESH ACTION ON ALL MEMORY BANKS OF THE MEMORY SYSTEM WITHIN REFRESH WINDOW This application claims the benefit of U.S. provisional application Ser. No. 62/522,816, filed on Jun. 21, 2017, the disclosure of which is incorporated by reference herein in its entirety.

FIELD OF THE INVENTION

The invention relates to a memory, and more particularly to a refresh control method for a memory system.

BACKGROUND OF THE INVENTION

Generally, a memory system comprises a memory controller and a dynamic random access memory (DRAM). The memory controller is connected with the DRAM. The memory controller can write data into the DRAM or read data from the DRAM. For example, a double data rate DRAM (also abbreviated as DDR DRAM) is one of the common DRAMs.

FIG. 1 illustrates the architecture of a conventional memory system. As shown in FIG. 1, the memory system 100 comprises a memory controller 120 and a DRAM 110. Moreover, plural pins of the memory controller 120 are connected with corresponding pins of the DRAM 110 in order to transmit plural control signals.

As shown in FIG. 1, the control signals include a clock signal CLK, command/address signals CA6~CA0 and a chip select signal CS. The command/address signals CA6~CA0 and the chip select signal CS are also referred as a command signal CMD.

As known, the DRAM 110 comprises plural memory banks. Each memory bank comprises plural memory cells. Each memory cell comprises a storage capacitor. The DRAM 110 further comprises a refreshing circuit. The refreshing circuit is used for refreshing the memory cells of the memory banks in order to prevent data loss of the storage capacitors.

For preventing data loss of the storage capacitors, the refreshing circuit has to refresh all memory cells of the memory cell array during a refresh window. Since the data loss rate of the DRAM 110 is related to the ambient temperature, the DRAM 110 can automatically change the refresh window $t_{REFi}$ according to the ambient temperature. Generally, as the operating temperature of the DRAM 110 increases, the refresh window $t_{REFi}$ becomes shorter and the refresh rate of the refresh rate of the DRAM 110 becomes faster. Whereas, as the operating temperature of the DRAM 110 decreases, the refresh window $t_{REFi}$ becomes longer and the refresh rate of the refresh rate of the DRAM 110 becomes slower.

FIG. 2 illustrates the relationship between the refresh state and the refresh window of the DRAM. Generally, when the refresh state of the DRAM 110 is 1 time state (×1), the DRAM 110 is operated at the normal temperature. Meanwhile, the refresh window $t_{REFi}$ is 3.9 μs. Consequently, the refresh actions have to be performed on all memory banks of the DRAM 110 within the time period of 3.9 μs.

As the operating temperature of the DRAM 110 continuously increases, the refresh state of the DRAM 110 is gradually changed from the 1 time state (×1) to 0.125 time state (×0.125) for example. For example, if the refresh state of the DRAM 110 is 0.25 time state (×0.25), the refresh window $t_{REFi}$ is 0.975 μs. Consequently, the refresh actions have to be performed on all memory banks of the DRAM 110 within the time period of 0.975 μs.

As the operating temperature of the DRAM 110 continuously decreases, the refresh state of the DRAM 110 is gradually changed from the 1 time state (×1) to 8 times state (×8) for example. For example, if the refresh state of the DRAM 110 is 4 times state (×4), the refresh window $t_{REFi}$ is 15.6 μs. Consequently, the refresh actions have to be performed on all memory banks of the DRAM 110 within the time period of 15.6 μs.

After the memory controller 120 reads the refresh state of the DRAM 110 and realizes the refresh window $t_{REFi}$, the memory controller 120 issues a plurality of refresh commands to the DRAM 110 within the refresh window $t_{REFi}$. According to the refresh command, the refreshing circuit of the DRAM 110 performs a refresh action on the one memory bank of the DRAM 110.

For example, in case that the memory controller 120 issues a per-bank refresh command to the DRAM 110, the refreshing circuit of the DRAM 110 performs a refresh action on a designated memory bank according to the per-bank refresh command.

For example, the DRAM 110 comprises N memory banks. The memory controller 120 has to issue N per-bank refresh commands to the DRAM 110 within the refresh window $t_{REFi}$. Consequently, the refreshing circuit of the DRAM 110 performs the refresh actions on the N memory banks within the refresh window $t_{REFi}$.

According to the DRAM specifications, the time interval between two per-bank refresh commands is determined according to the memory system. For example, in the memory system 100 with 16 memory banks and 3G-byte capability, two successive per-bank refresh commands issued by the memory controller 120 are separated by at least 90 ns. Consequently, it takes 1440 ns (i.e., 90 ns×16=1440 ns) to issue 16 per-bank refresh commands.

As shown in FIG. 2, the refresh window $t_{REFi}$ of the DRAM 110 in the 0.25 time state (×0.25) is 0.975 μs (i.e., 975 ns), and the refresh window $t_{REFi}$ of the DRAM 110 in the 0.125 time state (×0.125) is 0.4875 s (i.e., 487.5 ns).

Obviously, in case that the DRAM 110 in the 0.25 time state (×0.25) or the 0.125 time state (×0.125), the memory controller 120 cannot issue the sufficient number of per-bank refresh commands to the DRAM 110 within the refresh window $t_{REFi}$. Since the refresh actions cannot be successfully performed on all the memory banks of the DRAM 110 within the refresh window $t_{REFi}$, the possibility of losing data of the DRAM 110 increases.

SUMMARY OF THE INVENTION

An embodiment of the invention provides a refresh control method for a memory controller of a memory system. The memory controller is connected with a memory device. The memory device includes plural memory banks. The refresh control method includes the following steps. Firstly, a refresh state of the memory device is read, and thus a refresh window is realized. Then, a refresh command is issued to the memory device according to the refresh state. The refresh command contains a memory bank number field and a memory bank count field. The memory bank count field indicates a first count. The first count of memory banks are selected from the plural memory banks of the memory device according to the memory bank number field and the first count. Moreover, a refresh operation is performed on the first count of memory banks.

Another embodiment of the invention provides a refresh control method for a memory device of a memory system. The memory device is connected with a memory controller. The memory device includes plural memory banks. The refresh control method includes the following steps. Firstly, a refresh command is received from the memory controller. Then, a first count of memory banks are selected from the plural memory banks according to a memory bank number field and a memory bank count field of the refresh command. The memory bank count field indicates a first count. Then, a refresh action is performed on the selected first count of memory banks.

Another embodiment of the invention provides a refresh control method for a memory controller of a memory system. The memory controller is connected with a memory device. The memory device includes a mode register and plural memory banks. The refresh control method includes the following steps. Firstly, a refresh state of the memory device is read, and thus a refresh window is realized. Then, a mode register write command is issued to modify a content of a memory bank count field in the mode register. The memory bank count field indicates a first count. Then, a refresh command is issued to the memory device according to the refresh state. The refresh command contains a memory bank number field. The first count of memory banks are selected from the plural memory banks of the memory device according to the memory bank number field and the first count. Moreover, a refresh operation is performed on the first count of memory banks.

Another embodiment of the invention provides a refresh control method for a memory device of a memory system. The memory device is connected with a memory controller. The memory device includes a mode register and plural memory banks. The refresh control method includes the following steps. Firstly, a refresh command is received from the memory controller. Then, a first count of memory banks are selected from the plural memory banks according to a memory bank number field of the refresh command and a memory bank count field in the in the mode register. The memory bank count field indicates the first count. Then, a refresh action is performed on the selected first count of memory banks.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which:

FIG. 5D illustrates a fourth example of the refresh command;

FIG. 5E illustrates a fifth example of the refresh command;

FIG. 6A is a flowchart illustrating a refresh control method for the memory controller of the memory system according to a first embodiment of the invention;

FIG. 6B is a flowchart illustrating a refresh control method for the DRAM of the memory system according to the first embodiment of the invention;

FIG. 8 illustrates the contents of another refresh command used in the memory system of the invention;

FIG. 9A is a flowchart illustrating a refresh control method for the memory controller of the memory system according to a second embodiment of the invention; and FIG. 9B is a flowchart illustrating a refresh control method for the DRAM of the memory system according to the second embodiment of the invention.

DETAILED DESCRIPTION OF PREFERRED EMBODIMENTS

The invention provides refresh control method for a memory system. The memory system comprises a dynamic random access memory (DRAM) and a memory controller. In the memory system, a refresh command is specially designed. According to the content of the refresh command, a refreshing circuit performs a refresh action on plural memory banks of the DRAM. Consequently, the memory controller can perform the refresh action on all memory banks within the refresh window $t_{REFi}$.

Figures 1, 2:
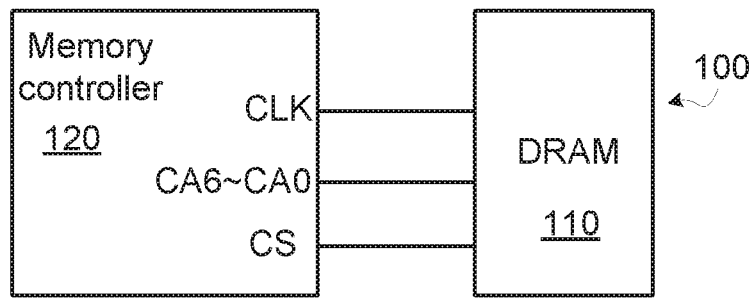
FIG. 1 (prior art) illustrates the architecture of a conventional memory system.
FIG. 2 (prior art) illustrates the relationship between the refresh state and the refresh window of the DRAM.
Figures 3, 4, 5A, 5B, 5C:
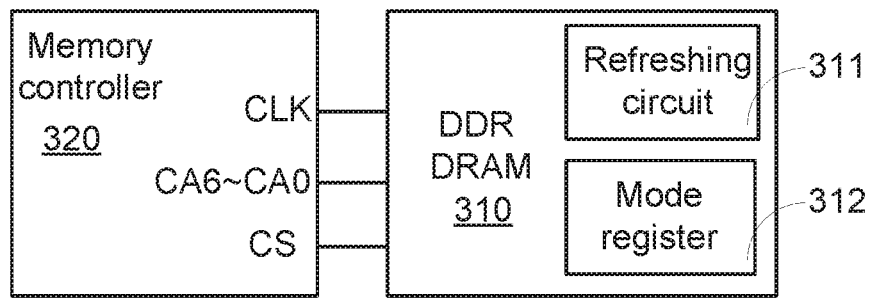
FIG. 3 illustrates the architecture of a memory system according to an embodiment of the invention.
FIG. 4 illustrates the contents of a refresh command used in the memory system of the invention.
FIG. 5A illustrates a first example of the refresh command.
FIG. 5B illustrates a second example of the refresh command.
FIG. 5C illustrates a third example of the refresh command.

FIG. 3 illustrates the architecture of a memory system according to an embodiment of the invention. As shown in FIG. 3, the memory system 300 comprises a memory controller 320 and a DDR DRAM 310. Moreover, plural pins of the memory controller 320 are connected with corresponding pins of the DDR DRAM 310 in order to transmit plural control signals. Moreover, the DRAM 310 comprises a refreshing circuit 311 and a mode register 312.

The DRAM 310 is a low power third generation DDR DRAM (also abbreviated as LPDDR3 DRAM), a low power fourth generation DDR DRAM (also abbreviated as LPDDR4 DRAM) or a low power fifth generation DDR DRAM (also abbreviated as LPDDR5 DRAM).

As shown in FIG. 3, the control signals include a clock signal CLK, command/address signals CA6~CA0 and a chip select signal CS. The command/address signals CA6~CA0 and the chip select signal CS are also referred as a command signal CMD.

In accordance with the invention, the memory controller 320 issues a refresh command to the DRAM 310. According to the parameters of the refresh command, the refreshing circuit 311 performs a refresh action on the plural memory banks of the DRAM 310. Consequently, the memory controller 320 can perform the refresh action on all memory banks of the DRAM 310 within the refresh window $t_{REFi}$.

FIG. 4 illustrates the contents of a refresh command used in the memory system of the invention.

When the clock signal CLK is in the rising edge, the content of a first portion of the refresh command indicates that the chip select signal CS is in the high level state H, the command/address signals CA6 and CA2~CA0 are in the low level state L, and the command/address signals CA5~CA3 are in the high level state H.

When the clock signal CLK is in the falling edge, the contents of the chip select signal CS and the command/address signals CA6~CA0 indicate a second portion of the refresh command.

The chip select signal CS is in a valid level state X. The command/address signals CA3~CA0 are related to a memory bank serial number field or a memory bank number field (CA3~CA0) to indicate the serial numbers of the memory banks to be refreshed. The command/address signals CA5~CA4 are related to a memory bank count field MB to indicate the count of memory banks to be refreshed. The command/address signal CA6 is an all-bank refresh field AB to indicate whether the all-bank refresh action is needed.

The valid level state X is the low level state L or the high level state H. Hereinafter, various refresh commands for the DRAM 310 with 16 memory banks, for example the zeroth memory bank (Bank$_0$) to the fifteenth memory bank (Bank$_{15}$), will be described. Since the first portion of the refresh command is identical, only the second portion of the refresh command will be described.

FIG. 5A illustrates a first example of the refresh command. In case that the command/address signal CA6 in the second portion of the refresh command is in the high level state H, the memory controller 320 requests the refreshing circuit 311 to perform the all-bank refresh action. That is, if the command/address signal CA6 in the second portion of the refresh command is the high level state H, the refreshing circuit 311 ignores the levels of the command/address signals CA5~CA0. Consequently, the refreshing circuit 311 performs the refresh action on all memory banks of the DRAM 310 directly.

In case that the command/address signal CA6 in the second portion of the refresh command is in the low level state L, the refresh command from the memory controller 320 is not related to the all-bank refresh action. According to the memory bank serial number field and the memory bank count field (i.e., the command/address signals CA5~CA0), the refreshing circuit 311 determines which memory banks with the designated serial number need to be refreshed.

In case that the memory bank count field (i.e., the command/address signals CA5~CA4) is "L,L", it means that only one memory bank needs to be refreshed. The serial number of the memory bank to be refreshed is determined according to the content of the memory bank serial number field (i.e., the command/address signals CA3~CA0).

In case that the memory bank count field (i.e., the command/address signals CA5~CA4) is "L,H", it means that two memory banks need to be refreshed. The serial numbers of the two memory banks to be refreshed are determined according to the content of the memory bank serial number field (i.e., the command/address signals CA2~CA0).

In case that the memory bank count field (i.e., the command/address signals CA5~CA4) is "H,L", it means that four memory banks need to be refreshed. The serial numbers of the four memory banks to be refreshed are determined according to the content of the memory bank serial number field (i.e., the command/address signals CA1~CA0).

In case that the memory bank count field (i.e., the command/address signals CA5~CA4) is "H,H", it means that eight memory banks need to be refreshed. The serial numbers of the eight memory banks to be refreshed are determined according to the content of the memory bank serial number field (i.e., the command/address signals CA0).

FIG. 5B illustrates a second example of the refresh command. In case that the memory bank count field (i.e., the command/address signals CA5~CA4) is "L,L", it means that only one memory bank needs to be refreshed. Moreover, the content of the memory bank serial number field (i.e., the command/address signals CA3~CA0) is "H, H, L, L". That is, the serial number of the memory bank is "1100", which denotes the twelfth memory bank (Bank12). Consequently, the refreshing circuit 311 performs the refresh action on the twelfth memory bank (Bank12) of the DRAM 310. It is noted that the levels of the command/address signals CA3~CA0 are not restricted. For example, in another embodiment, the content of the memory bank serial number field (i.e., the command/address signals CA3~CA0) is "L, H, L, H", which denotes the fifth memory bank (Bank5).

FIG. 5C illustrates a third example of the refresh command. In case that the memory bank count field (i.e., the command/address signals CA5~CA4) is "L,H", it means that two memory banks need to be refreshed. Moreover, the content of the memory bank serial number field (i.e., the command/address signals CA3~CA0) is "X, L, H, H". That is, the serial number of the memory bank is "X011". The serial number "X011" includes the serial number "0011" (i.e., the third memory bank (Bank3)) and the serial number "1011" (i.e., the eleventh memory bank (Bank11)). Consequently, the refreshing circuit 311 performs the refresh action on the third memory bank (Bank3) and the eleventh memory bank (Bank11) of the DRAM 310. It is noted that the levels of the command/address signals CA3~CA0 are not restricted. For example, in another embodiment, the content of the memory bank serial number field (i.e., the command/address signals CA3~CA0) is "X, L, L, H", which denotes the first memory bank (Bank$_1$) and the ninth memory bank (Bank$_9$).

FIG. 5D illustrates a fourth example of the refresh command. In case that the memory bank count field (i.e., the command/address signals CA5~CA4) is "H,L", it means that four memory banks need to be refreshed. Moreover, the content of the memory bank serial number field (i.e., the command/address signals CA3~CA0) is "X, X, L, H". That is, the serial number of the memory bank is "XX01". The serial number "XX01" includes the serial number "0001" (i.e., the first memory bank (Bank$_1$)), the serial number "0101" (i.e., the fifth memory bank (Bank$_5$)), the serial number "1001" (i.e., the ninth memory bank (Bank$_9$)) and the serial number "1101" (i.e., the thirteenth memory bank (Bank$_{13}$)). Consequently, the refreshing circuit 311 performs the refresh action on the first memory bank (Bank$_1$), the fifth memory bank (Bank$_5$), the ninth memory bank (Bank$_9$) and the thirteenth memory bank (Bank$_{13}$) of the DRAM 310. It is noted that the levels of the command/address signals CA3~CA0 are not restricted. For example, in another embodiment, the content of the memory bank serial number field (i.e., the command/address signals CA3~CA0) is "X, X, H, H", which denotes the third memory bank (Bank$_3$), the seventh memory bank (Bank$_7$), the eleventh memory bank (Bank$_{11}$) and the fifteenth memory bank (Bank$_{15}$).

FIG. 5E illustrates a fifth example of the refresh command. In case that the memory bank count field (i.e., the command/address signals CA5~CA4) is "H,H", it means that eight memory banks need to be refreshed. Moreover, the content of the memory bank serial number field (i.e., the command/address signals CA3~CA0) is "X, X, X, H". The serial number "X, X, X, H" includes the serial number "0001" (i.e., the first memory bank (Bank1)), the serial number "0011" (i.e., the third memory bank (Bank3)), the serial number "0101" (i.e., the fifth memory bank (Bank5)), the serial number "0111" (i.e., the seventh memory bank (Bank7)), the serial number "1001" (i.e., the ninth memory bank (Bank9)), the serial number "1011" (i.e., the eleventh memory bank (Bank11)), the serial number "1101" (i.e., the thirteenth memory bank (Bank3)) and the serial number "1011" (i.e., the fifteenth memory bank (Bank15)). It is noted that the levels of the command/address signals CA3~CA0 are not restricted. For example, in another embodiment, the content of the memory bank serial number field (i.e., the command/address signals CA3~CA0) is "X, X, X, L", which denotes the even-numbered memory banks (i.e., the zeroth memory bank ($Bank_0$), the second memory bank ($Bank_2$), the fourth memory bank ($Bank_4$), the sixth memory bank ($Bank_6$), the eighth memory bank ($Bank_8$), the tenth memory bank ($Bank_{10}$), the twelfth memory bank ($Bank_{12}$) and the fourteenth memory bank ($Bank_{14}$).

FIG. 6A is a flowchart illustrating a refresh control method for the memory controller of the memory system according to a first embodiment of the invention. FIG. 6B is a flowchart illustrating a refresh control method for the DRAM of the memory system according to the first embodiment of the invention.

Please refer to FIG. 6A. Firstly, the memory controller 320 of the memory system 300 reads a refresh state of the DRAM 310 to realize a refresh window $t_{REFi}$ (Step S610). Then, the memory controller 320 issues a refresh command to the DRAM 310 according to the refresh state of the DRAM 310 (Step S620). Consequently, the memory controller 320 controls the refreshing circuit 311 to perform a refresh action on all memory banks of the DRAM 310 within the refresh window $t_{REFi}$.

Please refer to FIG. 6B. Firstly, the DRAM 310 of the memory system 300 receives the refresh command from the memory controller 320 (Step S630). Then, the DRAM 310 selects at least one memory bank according to a memory bank serial number field and a memory bank count field of the refresh command (Step S640). Consequently, the refreshing circuit 311 performs a refresh action on the at least one selected memory bank of the DRAM 310 (Step S650).

From the above descriptions, the invention provides a refresh command for use in the memory system 300. The memory controller 320 is capable of dynamically changing the number of memory banks of the DRAM 310 that need to be refreshed. Consequently, the memory controller 320 can control the refreshing circuit 311 to perform the refresh action on all memory banks of the DRAM 310 within the refresh window $t_{REFi}$.

Figure 7:
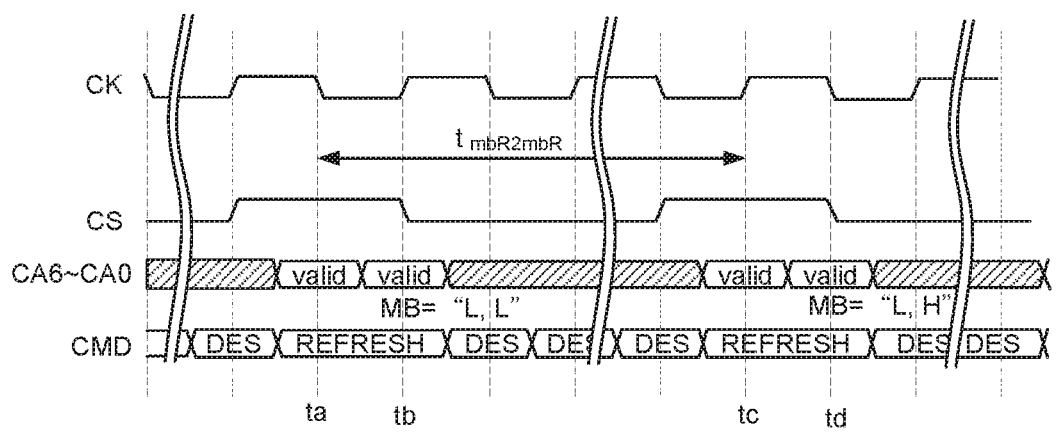
FIG. 7 shows an example of dynamically issuing refresh commands with different counts set in memory bank count field (MB)

FIG. 7 shows an example of dynamically issuing refresh commands with different counts set in memory bank count field (MB). At the time point ta, the memory controller 320 issues a first portion of a refresh command. At the time point tb, the memory controller 320 issues a second portion of a refresh command and the count "L, L" is set in the memory bank count field (MB). After the time point tb, the refresh circuit 311 of the DDR DRAM 310 refreshes one memory bank according to the content of the memory bank serial number field in the second portion of the refresh command.

At the time point tc, the memory controller 320 issues a first portion of another refresh command. At the time point td, the memory controller 320 issues a second portion of another refresh command and the count "L, H" is set in the memory bank count field (MB). After the time point td, the refresh circuit 311 of the DDR DRAM 310 refreshes two memory banks according to the content of the memory bank serial number field in the second portion of another refresh command.

The DES command is a deselect command of the DDR DRAM 310. Furthermore, a parameter $t_{mbR2mbR}$ (time interval of multi-bank refresh to multi-bank refresh) is used to define a refresh time interval between two refresh commands. The refresh time interval of $t_{mbR2mbR}$ is defined in DDRAM specification. As shown in FIG. 7, the memory controller 320 has to adjust the two issuing times of the two refresh commands based on the refresh time interval $t_{mbR2mbR}$.

Since the memory bank serial number field and the memory bank count field of the refresh command are related to the at least one memory bank, the refreshing circuit 311 of the DRAM 310 can perform the refresh action on the at least one memory bank. Consequently, the memory controller 320 issues the refresh command to control the refreshing circuit 311 to perform the refresh action on all memory banks of the DRAM 310 within the refresh window $t_{REFi}$.

Moreover, the refresh state of the DRAM 310 is stored in the mode register 312 of the DRAM 310. In an embodiment, the memory controller 320 issues a mode register read command to the DRAM 310. According to the mode register read command, the refresh state stored in the mode register 312 is acquired by the memory controller 320. Consequently, the memory controller 320 realizes the refresh window $t_{REFi}$.

In the above embodiments, the number of memory banks of the DRAM 310 to be refreshed is determined according to the parameters of the refresh command. It is noted that numerous modifications and alterations may be made while retaining the teachings of the invention. For example, in another embodiment, the memory bank count field is defined in the mode register 312. The memory banks of the DRAM 310 to be refreshed are determined according to the memory bank serial number field of the refresh command and the memory bank count field of the mode register 312.

FIG. 8 illustrates the contents of another refresh command used in the memory system of the invention. The content of the second portion of the refresh command in this embodiment is distinguished from that of FIG. 4. In this embodiment, only the memory bank serial number field (CA3~CA0) and the all-bank refresh field are used to define the second portion of the refresh command. That is, the memory bank count field MB is not defined in the second portion of the refresh command.

In this embodiment, the memory bank count field is defined in the mode register 312. According to a mode register write command from the memory controller 320, the content of the memory bank count field in the mode register 312 is written or modified. In an embodiment, the memory bank count field in the mode register 312 has two bits. In case that the memory bank count field is "L,L", it means that only one memory bank needs to be refreshed. In case that the memory bank count field is "L,H", it means that two memory banks need to be refreshed. In case that the memory bank count field is "H,L", it means that four memory banks need to be refreshed. In case that the memory bank count field is "H,H", it means that eight memory banks need to be refreshed.

FIG. 9A is a flowchart illustrating a refresh control method for the memory controller of the memory system according to a second embodiment of the invention. FIG. 8B is a flowchart illustrating a refresh control method for the DRAM of the memory system according to the second embodiment of the invention.

Please refer to FIG. 9A. Firstly, the memory controller 320 of the memory system 300 reads a refresh state of the DRAM 310 to realize a refresh window $t_{REFi}$ (Step S810). Then, the memory controller 320 issues a mode register write command to modify a content of a memory bank count field in the mode register 312 (Step S820). Then, the memory controller 320 issues a refresh command to the DRAM 310 according to the refresh state of the DRAM 310 (Step S830). Consequently, the memory controller 320 controls the refreshing circuit 311 to perform a refresh action on all memory banks of the DRAM 310 within the refresh window $t_{REFi}$.

Please refer to FIG. 9B. Firstly, the DRAM 310 of the memory system 300 receives the refresh command from the memory controller 320 (Step S840). Then, the DRAM 310 selects at least one memory bank according to a memory bank serial number field of the refresh command and the memory bank count field in the mode register (Step S850). Consequently, the refreshing circuit 311 performs a refresh action on the at least one selected memory bank of the DRAM 310 (Step S860).

From the above descriptions, the invention provides a refresh command for use in the memory system 300. The memory controller 320 is capable of modifying the content of the memory bank count field in order to dynamically change the number of memory banks of the DRAM 310 that need to be refreshed.

In the above embodiment, the memory bank count in the memory bank count field is smaller than the total memory bank count. If the memory bank count in the memory bank count field is larger than 1, the refresh action is performed on plural memory banks of the DRAM 310. Consequently, the memory controller 320 can effectively use the refresh command to control the refreshing circuit 311 to perform the refresh action on all memory banks of the DRAM 310 within the refresh window $t_{REFi}$.

The contents of the first portions and the second portions of the refresh commands as shown in FIG. 4 and FIG. 8 are not restricted. That is, those skilled in the art may define the first portion and the second portion of the refresh command while retaining the teachings of the invention.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A refresh control method for a memory controller of a memory system, the memory controller being connected with a memory device, the memory device comprising plural memory banks, the refresh control method comprising steps of:
reading a refresh state of the memory device to realize a refresh window;
issuing a refresh command to the memory device according to the refresh state, wherein the refresh command contains a memory bank number field and a memory bank count field, and the memory bank count field indicates a first count, wherein the first count of memory banks are selected from the plural memory banks of the memory device according to the memory bank number field and the first count, and a refresh operation is performed on the first count of memory banks; and
issuing a another refresh command to the memory device, wherein the memory bank count field of the another refresh command indicates a second count, the second count is different from the first count, and the memory controller adjusts issuing times of the refresh command and the another refresh command based on a refresh time interval,
wherein the first count is larger than 1 and smaller than a total count of the plural memory banks, and the second count is larger than 1 and smaller than the total count of the plural memory banks.

2. The refresh control method as claimed in claim 1, further comprising a step of issuing a mode register read command from the memory controller to the memory device, so that the refresh state stored in a mode register of the memory device is acquired by the memory controller.

3. The refresh control method as claimed in claim 1, wherein the memory controller transmits plural control signals to the memory device, and the plural control signals include a clock signal, a chip select signal and plural command/address signals.

4. The refresh control method as claimed in claim 3, wherein a first portion of the plural command/address signals is related to the memory bank number field and a second portion of the plural command/address signals is related to the memory bank count field.

5. A refresh control method for a memory device of a memory system, the memory device being connected with a memory controller, the memory device comprising plural memory banks, the refresh control method comprising steps of:
receiving a refresh command from the memory controller;
selecting a first count of memory banks from the plural memory banks according to a memory bank number field and a memory bank count field of the refresh command, wherein the memory bank count field indicates the first count; and
performing a refresh action on the selected first count of memory banks;
wherein the memory controller transmits plural control signals to the memory device, and the plural control signals include plural command/address signals;
wherein a first portion of the plural command/address signals is related to the memory bank number field and a second portion of the plural command/address signals is related to the memory bank count field,
wherein the first count is larger than 1 and smaller than a total count of the plural memory banks.

6. The refresh control method as claimed in claim 5, wherein the plural control signals further include a clock signal and a chip select signal.

7. A refresh control method for a memory controller of a memory system, the memory controller being connected with a memory device, the memory device comprising a mode register and plural memory banks, the refresh control method comprising steps of:
reading a refresh state of the memory device to realize a refresh window;
issuing a mode register write command to modify a content of a memory bank count field in the mode register, wherein the memory bank count field indicates a first count; and issuing a refresh command to the memory device according to the refresh state, wherein the refresh command contains a memory bank number field,
wherein the first count of memory banks are selected from the plural memory banks of the memory device according to the memory bank number field and the first count, and a refresh operation is performed on the first count of memory banks;
wherein the memory controller transmits plural control signals to the memory device, and the plural control signals include plural command/address signals;
wherein a first portion of the plural command/address signals is related to the memory bank number field,
wherein the first count is larger than 1 and smaller than a total count of the plural memory banks.

8. The refresh control method as claimed in claim 7, further comprising a step of issuing a mode register read command from the memory controller to the memory device, so that the refresh state stored in the mode register of the memory device is acquired by the memory controller.

9. The refresh control method as claimed in claim 7, wherein the plural control signals further include a clock signal and chip select signal.

10. A refresh control method for a memory device of a memory system, the memory device being connected with a memory controller, the memory device comprising a mode register and plural memory banks, the refresh control method comprising steps of:
receiving a refresh command from the memory controller;
selecting a first count of memory banks from the plural memory banks according to a memory bank number field of the refresh command and a memory bank count field in the in the mode register, wherein the memory bank count field indicates the first count; and
performing a refresh action on the selected first count of memory banks;
wherein the memory controller transmits plural control signals to the memory device, and the plural control signals include plural command/address signals;
wherein a first portion of the plural command/address signals is related to the memory bank number field,
wherein the first count is larger than 1 and smaller than a total count of the plural memory banks.

11. The refresh control method as claimed in claim 10, wherein the plural control signals further include a clock signal and chip select signal.

* * * * *